United States Patent
Yu (10) Patent No.: US 9,307,678 B2
(45) Date of Patent: Apr. 5, 2016

(54) LOW THERMAL RESISTANCE COOLER MODULE FOR EMBEDDED SYSTEM

(71) Applicant: ADLINK TECHNOLOGY INC., New Taipei (TW)

(72) Inventor: Li-Jie Yu, New Taipei (TW)

(73) Assignee: ADLINK TECHNOLOGY INC, New Taipei (TW)

( * ) Notice: Subject to any disclaimer, the term of this patent is extended or adjusted under 35 U.S.C. 154(b) by 573 days.

(21) Appl. No.: 13/733,597

(22) Filed: Jan. 3, 2013

(65) Prior Publication Data

US 2014/0182817 A1 Jul. 3, 2014

(51) Int. Cl.
*H05K 7/20* (2006.01)
*F28D 15/02* (2006.01)
*H01L 23/427* (2006.01)
*G06F 1/20* (2006.01)

(52) U.S. Cl.
CPC ........ *H05K 7/20809* (2013.01); *F28D 15/0275* (2013.01); *G06F 1/20* (2013.01); *H01L 23/427* (2013.01); *H05K 7/20336* (2013.01); *G06F 2200/201* (2013.01)

(58) Field of Classification Search
CPC .............. F28D 15/0275; H01L 23/427; H05K 7/20336
See application file for complete search history.

(56) References Cited

U.S. PATENT DOCUMENTS

| | | | |
|---|---|---|---|
| 7,301,774 B2 * | 11/2007 | Lee et al. | 361/719 |
| 7,885,072 B2 * | 2/2011 | Wu et al. | 361/700 |
| 2008/0007915 A1 * | 1/2008 | Chen | 361/701 |
| 2010/0186933 A1 * | 7/2010 | Chang et al. | 165/121 |
| 2012/0085520 A1 * | 4/2012 | Pfaffinger | 165/104.26 |

* cited by examiner

*Primary Examiner* — Leonard R Leo
(74) *Attorney, Agent, or Firm* — Muncy, Geissler, Olds & Lowe, P.C.

(57) ABSTRACT

A low thermal resistance cooler module includes a heat-transfer base member defining a recess and multiple elongated, curved locating grooves, flat heat pipes set in the elongated, curved locating grooves with respective hot interfaces thereof suspending in the recess and respective cold interfaces thereof bonded to the heat-transfer base member, a heat-transfer block fixedly mounted with the hot interfaces of the flat heat pipes in the recess of the heat-transfer base member for transferring waste heat from a heat source of an external circuit board by direct contact, and connection plates respectively connected between the heat-transfer block and the heat-transfer base member.

9 Claims, 9 Drawing Sheets

LOW THERMAL RESISTANCE COOLER MODULE FOR EMBEDDED SYSTEM

BACKGROUND OF THE INVENTION

1. Field of the Invention

The present invention relates to cooling technology for embedded system and more particularly, to a low thermal resistance cooler module for embedded system, which enables a heat-transfer block to be positively kept in contact with a heat source of a circuit board in the embedded system to evenly distribute the bearing pressure, reducing thermal resistance and facilitating quick dissipation of waste heat.

2. Description of the Related Art

Following fast development of technology, advanced computers having a relatively higher level of arithmetic function and faster operating speed have been continuously developed. During the operation of CPU, image processor and other electronic components of the mainboard in a high speed computer, industrial computer, computer server, embedded system or other computer design, much waste heat will be produced. In order to maintain the internal temperature of a computer in a predetermined operating temperature range, cooler modules may be used.

Different sizes of cooler modules may be used to fit different heat sources (electronic components) at a circuit board in a computer. Alternatively, cooler modules of one same size may be used with different thicknesses of heat-transfer plates to fit different heat sources (electronic components) at a circuit board in a computer. However, when setting a heat-transfer plate between a cooler module and a heat source (electronic component) at a circuit board, the thermal resistance between the cooler module and the heat source (electronic component) will be relatively increased. When increasing the thickness of the heat-transfer medium, the thermal resistance will be relatively increased.

Figure 9:
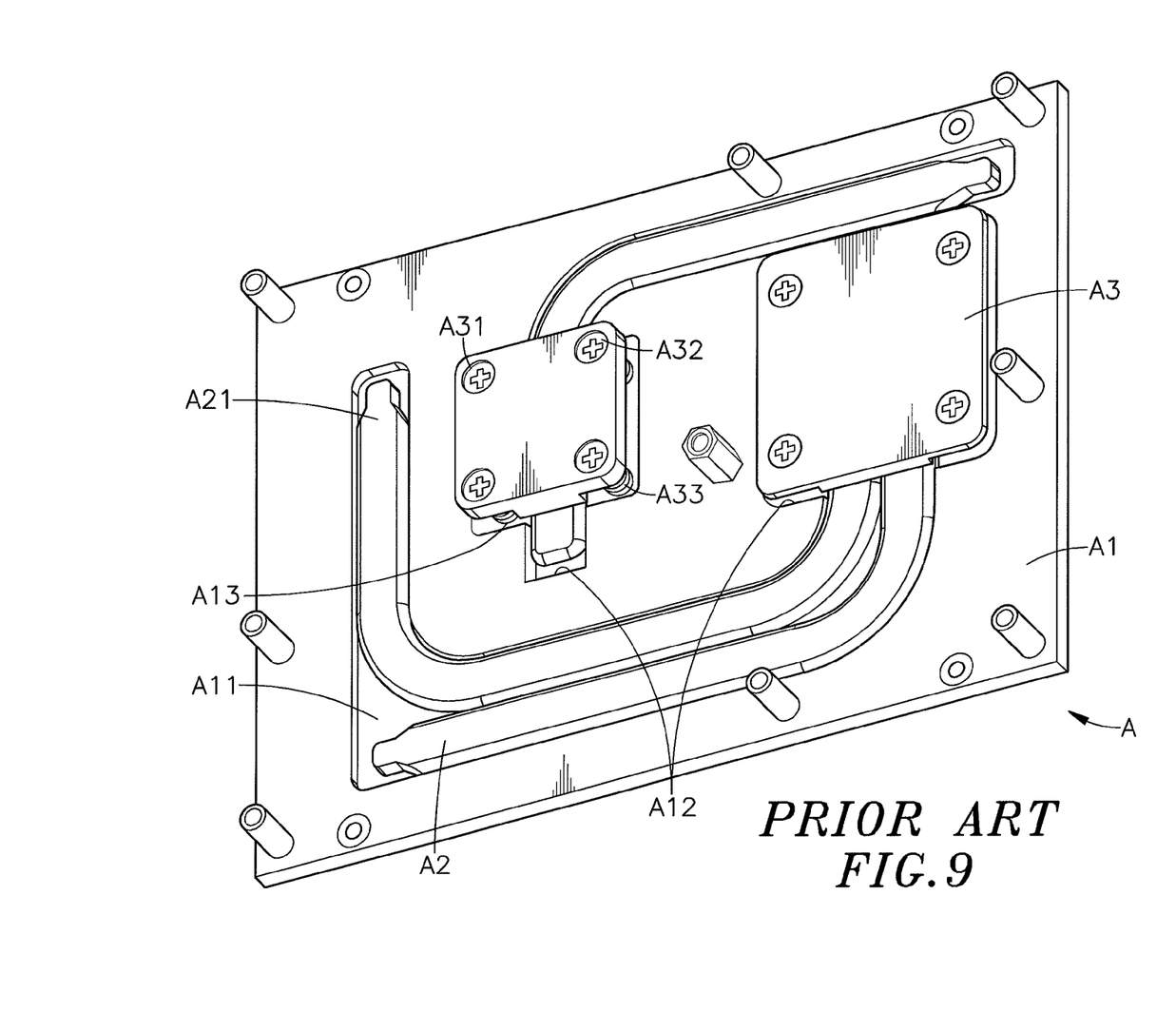
FIG. 9 is an oblique elevational view of a cooler module according to the prior art.

FIG. 9 illustrates a conventional cooler module A. According to this prior art design, the cooler module A comprises a flat base member A1 defining a plurality of heat pipe grooves A11, openings A12 and a plurality of screw holes A13, a plurality of flat heat pipes A2 set in the heat pipe grooves A11 and fixedly bonded to the flat base member A1, a plurality of metal blocks A3 bonded to respective one ends A21 of the flat heat pipes A2 and suspending above the openings A12 of the flat base member A1, and screws A32 respectively mounted in respective countersunk holes A31 of the metal blocks A3 and threaded into the screw holes A13 at the flat base member A1, and compression springs A33 respectively mounted around the screws A32 and stopped between the metal blocks A3 and the flat base member A1.

The aforesaid prior art cooler module A uses the compression springs A33 to support the metal blocks A3 on the flat base member A1, enabling the metal blocks A3 to be stopped against respective heat sources (electronic components) at an external circuit board. However, due to the arrangement of the compression springs A33 between the metal blocks A3 and the flat base member A1, the metal blocks A3 can simply be kept in contact with the top walls of the flat heat pipes A2, lowering the heat transfer efficiency. Further, when the metal blocks A3 are stopped against respective heat sources (electronic components) at an external circuit board, the pressure from the respective heat sources (electronic components) may not be evenly distributed through the metal blocks A3 to the flat heat pipes A2 and the compression springs A33, causing metal block surface damage and affecting structural stability. Further, when setting the compression springs A33 between the countersunk holes A31 of the metal blocks A3 and the flat base member A1 during installation, the compression springs A33 must be kept compressed, making installation much more difficult. An improvement in this regard is desired.

SUMMARY OF THE INVENTION

The present invention has been accomplished under the circumstances in view. It is therefore one object of the present invention to provide a low thermal resistance cooler module, which enables a heat-transfer block to be positively kept in contact with a heat source of a circuit board in an embedded system to evenly distribute the bearing pressure, reducing thermal resistance and facilitating quick dissipation of waste heat.

To achieve this and other objects of the present invention, a low thermal resistance cooler module comprises a heat-transfer base member defining a recess and multiple elongated, curved locating grooves, flat heat pipes set in the elongated, curved locating grooves with respective hot interfaces thereof suspending in the recess and respective cold interfaces thereof bonded to the heat-transfer base member, a heat-transfer block fixedly mounted with the hot interfaces of the flat heat pipes in the recess of the heat-transfer base member for transferring waste heat from a heat source of an external circuit board by direct contact, and connection plates respectively connected between the heat-transfer block and the heat-transfer base member. Further, a the heat sink is attached to a rectangular locating groove at the heat-transfer base member to hold down one flat heat pipe in one elongated, curved locating groove of the heat-transfer base member. By means of supporting the heat-transfer block on the connection plates above the recess of the heat-transfer base member, the heat-transfer block can be positively kept in contact with an external heat source at an external circuit board to absorb and transfer waste heat from the external heat source efficiently during operation of the external circuit board, enhancing quick heat dissipation.

Further, the heat sink comprises a heat-transfer plate arranged at the top side thereof; the heat-transfer block comprises a heat-transfer plate of a phase change material arranged at the top side thereof. Subject to the arrangement of the heat-transfer plate of the heat sink and the heat-transfer plate of the heat-transfer block, the heat sink and the heat-transfer block can be kept in contact with heat sources of an external circuit board positively, compensating any manufacturing tolerances or uneven component surfaces. Subject to the structural design of the heat-transfer base member and the heat-transfer block and the arrangement of the heat-transfer base member, the heat-transfer block, the flat heat pipes and the connection plates, the vertical thickness of the low thermal resistance cooler module can be minimized, providing a low profile characteristic.

Further, the heat-transfer block comprises a plurality of vertical screw holes respectively formed in respective mounting portions thereof. Further, the heat-transfer base member comprises a plurality of mating connection structures each comprising a screw hole. Further, each connection plate comprises a circular through hole at a first connection end thereof and an oblong through hole at a second end thereof. Further, the circular through holes and oblong through holes of the connection plates are respectively affixed to the vertical screw holes in the mounting portions of the heat-transfer block and the screw holes of the mating connection structures of the heat-transfer base member by by respective screws.

Further, the heat sink and the heat-transfer block are made of aluminum or copper alloy. When the low thermal resistance cooler module is installed in a circuit board to keep the heat sink and the heat-transfer block in positively contact with respective heat sources of the circuit board, the heat sink and the heat-transfer block absorb waste heat from the heat sources and transfer absorbed waste heat to the flat heat pipes, wherein, the liquid in the hot interface of each flat heat pipe turns into a vapor by absorbing heat from the hot interface; the vapor then travels along the respective flat heat pipe to the cold interface, condenses back into a liquid, releasing the latent heat; the liquid then returns to the hot interface through a capillary action where it evaporates once more and repeats the cycle.

DETAILED DESCRIPTION OF THE PREFERRED EMBODIMENT

Referring to FIGS. 1-4, a low thermal resistance cooler module for embedded system in accordance with the present invention is shown. The low thermal resistance cooler module comprises a heat-transfer base panel 1, a plurality of flat heat pipes 2, a heat sink 22, a heat-transfer block 3, and a plurality of connection plates 4.

The heat-transfer base member 1 comprises a flat base panel 11, a recess 12 located at the top wall of the flat base panel 11, a plurality of mating connection structures 13 located at the top wall of the flat base panel 11 around the recess 12, an opening 121 cut through the recess 12, a plurality of elongated, curved locating grooves 14 located at the top wall of the flat base panel 11 and extended from the opening 121 in the recess 12 for accommodating the flat heat pipes 2, a rectangular locating groove 141 located at the top wall of the flat base panel 11 across which one of elongated, curved heat pipe grooves 14 extends, and a plurality of upright female screw rods 15 extended from the top wall of the flat base panel 11 around the border area thereof. Each mating connection structure 13 comprises a positioning groove 132 extended from the recess 12, and a screw hole 131 disposed adjacent to the locating groove 132 remote from the recess 12.

The flat heat pipes 2 are respectively set in the elongated, curved heat pipe grooves 14, each having two opposing end portions 21, one forming a hot interface and other forming a cold interface.

The heat sink 22 is bonded to the rectangular locating groove 141 of the heat-transfer base member 1 to hold down one flat heat pipe 2, having a positioning groove 221 defined in the bottom side thereof and tightly attached to the flat heat pipe 2 and a heat-transfer plate 23 arranged at the top side thereof.

The heat-transfer block 3 is a rectangular block comprising a plurality of mounting portions 31 around the border area thereof, a stepped bottom groove 312 located at the bottom side of each mounting portion 31, a plurality of vertical screw holes 311 respectively formed in the mounting portions 31 in communication with the respective stepped bottom grooves 312, a positioning groove 32 defined in the bottom side thereof and tightly attached to one end portion 21 of each of the flat heat pipes 2, and a heat-transfer plate 33 of a phase change material arranged at the top side thereof.

The connection plates 4 each comprises opposing first connection end 41 and second connection end 42, a circular through hole 411 located at the first connection end 41 for the mounting of one respective tie screw 412, and an oblong through hole 421 located at the second connection end 42 for the mounting of one respective lock screw 422.

During installation of the low thermal resistance cooler module, set the flat heat pipes 2 in the elongated, curved heat pipe grooves 14 at the flat base panel 11 of the heat-transfer base member 1 to suspend one end portion 21 of each of the flat heat pipes 2 in the opening 121 in the recess 12 of the heat-transfer base member 1, and then bond the other end portion 21 of each of the flat heat pipes 2 to the flat base panel 11 of the heat-transfer base member 1 by welding, and then attach the heat-transfer block 3 to the recess 12 over the opening 121 to keep the positioning groove 32 in close contact with the respective end portions 21 of the flat heat pipes 2 and bond the respective end portions 21 of the flat heat pipes 2 and the heat-transfer block 3 together by welding, and then attach the heat sink 22 to the rectangular locating groove 141 of the heat-transfer base member 1 to have one flat heat pipe 2 be tightly received in the positioning groove 221 and bonded to the heat sink 22 by welding. It is to be understood that the aforesaid welding technique to affix the heat-transfer base member 1, the heat pipes 2, the heat sink 22 and the heat-transfer block 3 together is simple an application example of the present invention, other fastening technique or means or thermal adhesive may be used to achieve the same effect.

Thereafter, install the connection plates 4 to connect the respective first connection ends 41 and second connection ends 42 to the mounting portions 31 of the heat-transfer block 3 and the mating connection structures 13 of the heat-transfer base member 1. At this time, insert the first connection ends 41 of the connection plates 4 into the respective stepped bottom grooves 312 in the mounting portions 31 of the heat-transfer block 3, and then insert the respective tie screws 412 upwardly from the opening 121 of the heat-transfer base member 1 through the circular through holes 411 at the respective first connection ends 41 of the connection plates 4 and thread the respective tie screws 412 into the respective vertical screw holes 311 in the mounting portions 31 of the heat-transfer block 3, and then insert the respective lock screws 422 downwardly through the respective oblong through holes 421 at the second connection ends 42 of the connection plates 4 and thread the respective lock screws 422 into the screw holes 131 of the respective mating connection structures 13 of the heat-transfer base member 1. Thus, the heat-transfer block 3 is supported on the connection plates 4 at the heat-transfer base member 1.

As stated above, the first connection ends 41 and second connection ends 42 of the connection plates 4 are respectively fastened to the mounting portions 31 of the heat-transfer block 3 and the respective mating connection structures 13 of the heat-transfer base member 1 by tie screws 412 and lock screws 422. However, in actual application, welding, riveting, thermal adhesive bonding and other fastening techniques may be selectively used to achieve the same effect.

Further, in the aforesaid application example, tie screws 412 are inserted upwardly from the opening 121 of the heat-transfer base member 1 through the circular through holes 411 at the respective first connection ends 41 of the connection plates 4 and threaded into the respective vertical screw holes 311 in the mounting portions 31 of the heat-transfer block 3. Alternatively, the heat-transfer base member 1 can be configured without the aforesaid opening, and the tie screws 412 can be inserted upwardly through respective through holes (not shown) at the heat-transfer base member 1 and the circular through holes 411 at the respective first connection ends 41 of the connection plates 4 and threaded into the respective vertical screw holes 311 in the mounting portions 31 of the heat-transfer block 3.

Figure 1:
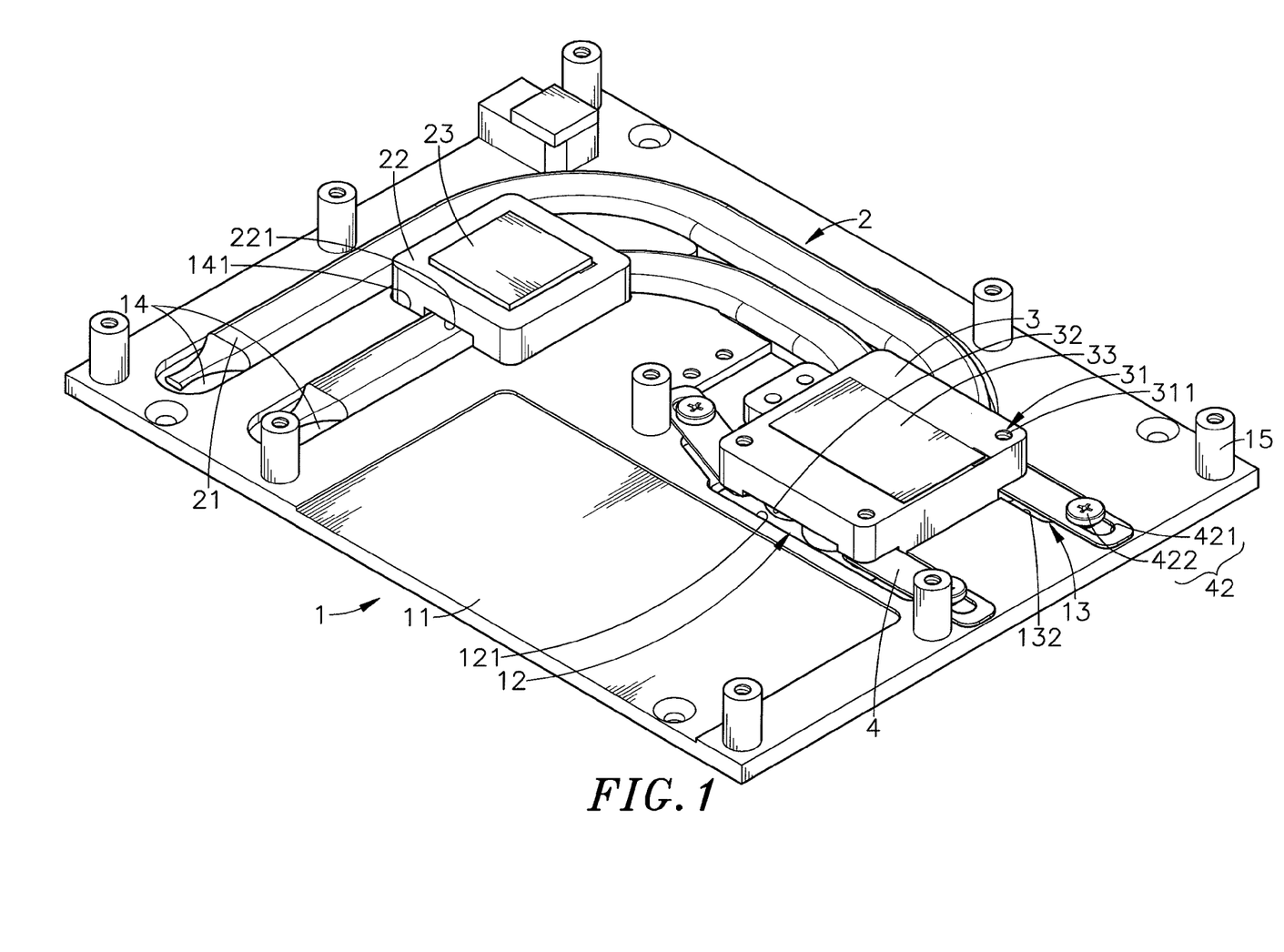
FIG. 1 is an oblique elevational view of a low thermal resistance cooler module in accordance with the present invention.
Figure 2:
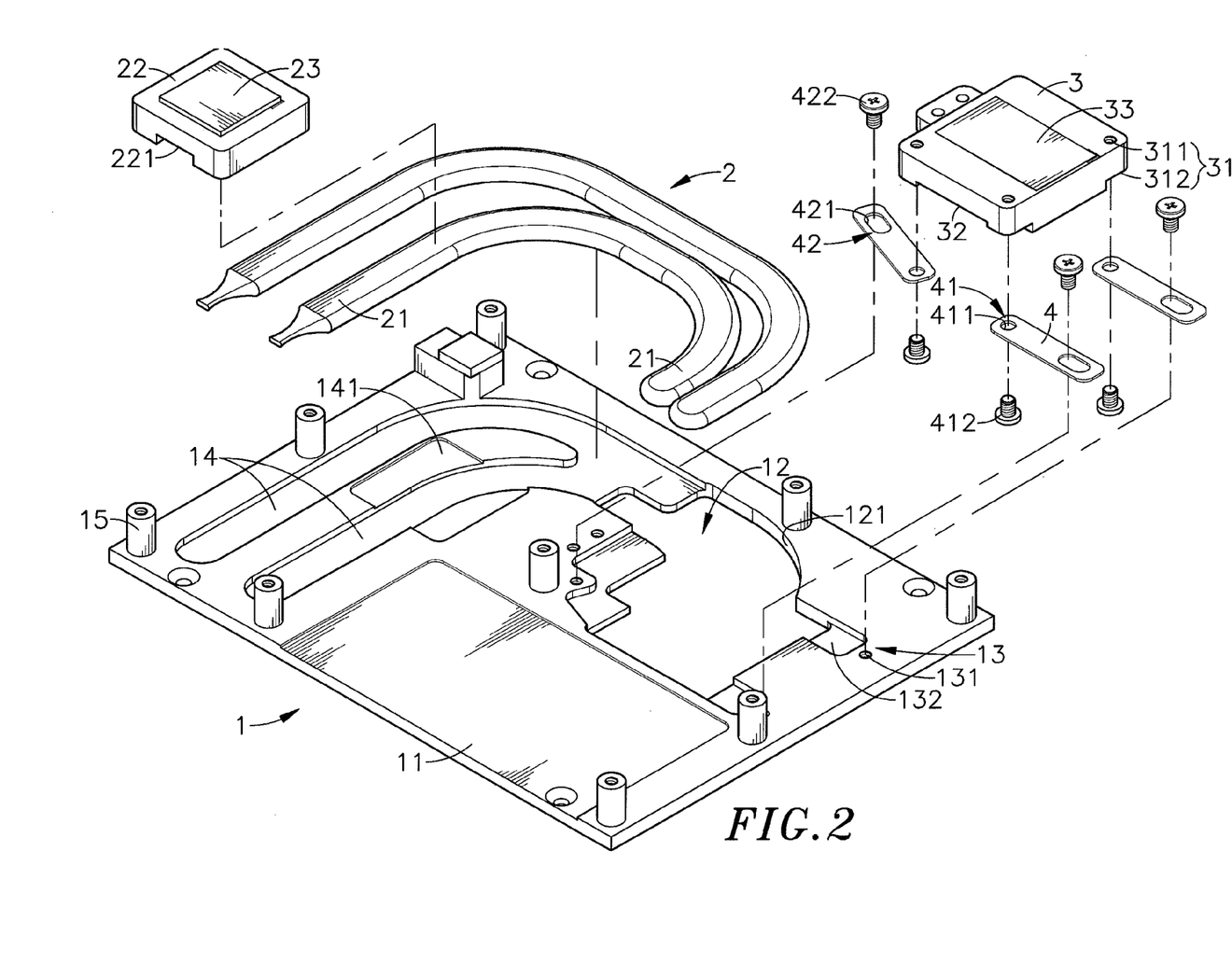
FIG. 2 is an exploded view of the low thermal resistance cooler module in accordance with the present invention.
Figure 3:
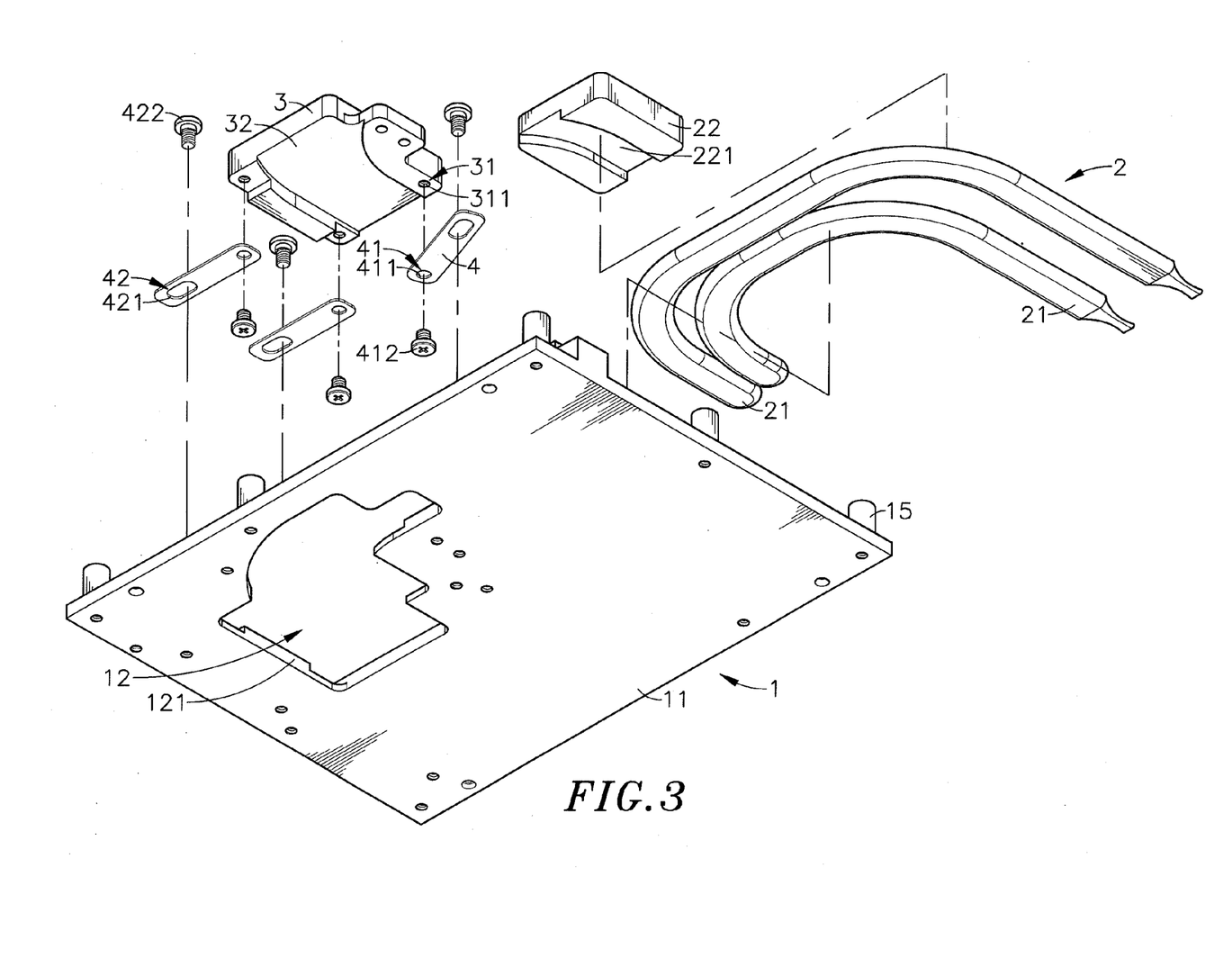
FIG. 3 corresponds to FIG. 2 when viewed from another angle.
Figure 4:
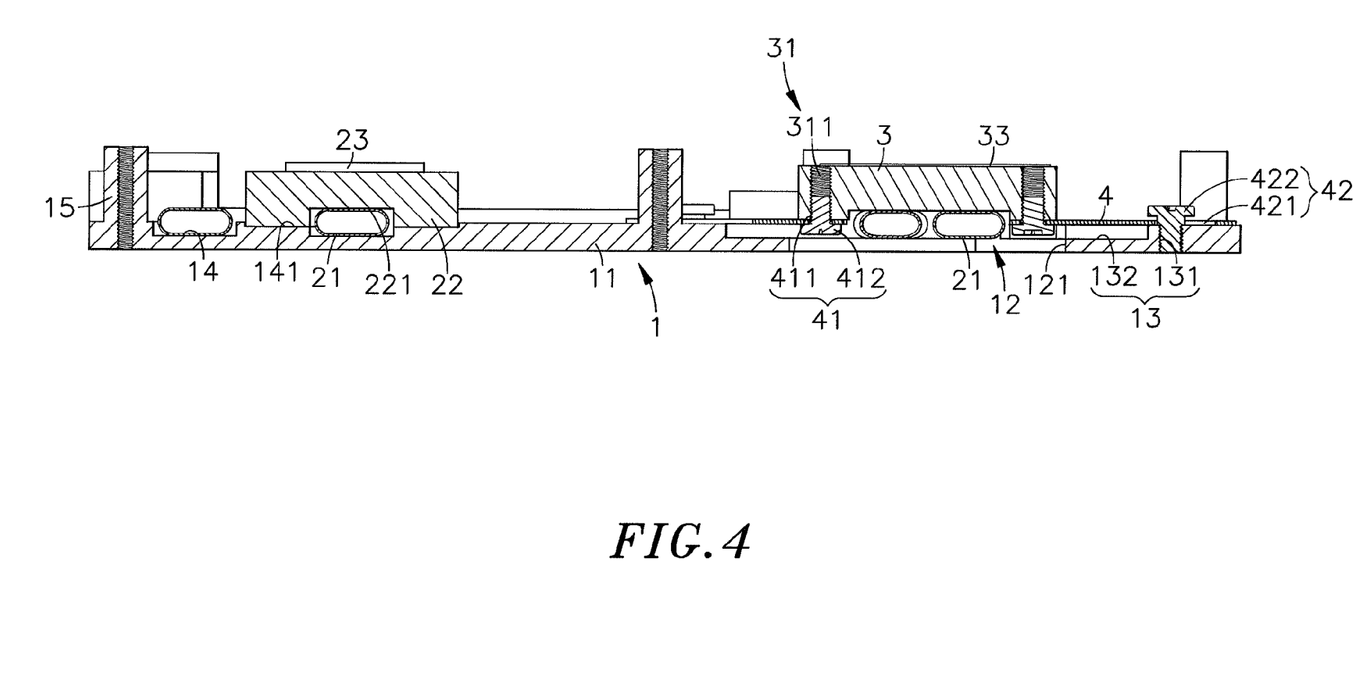
FIG. 4 is a sectional side view of the low thermal resistance cooler module in accordance with the present invention.
Figure 5:
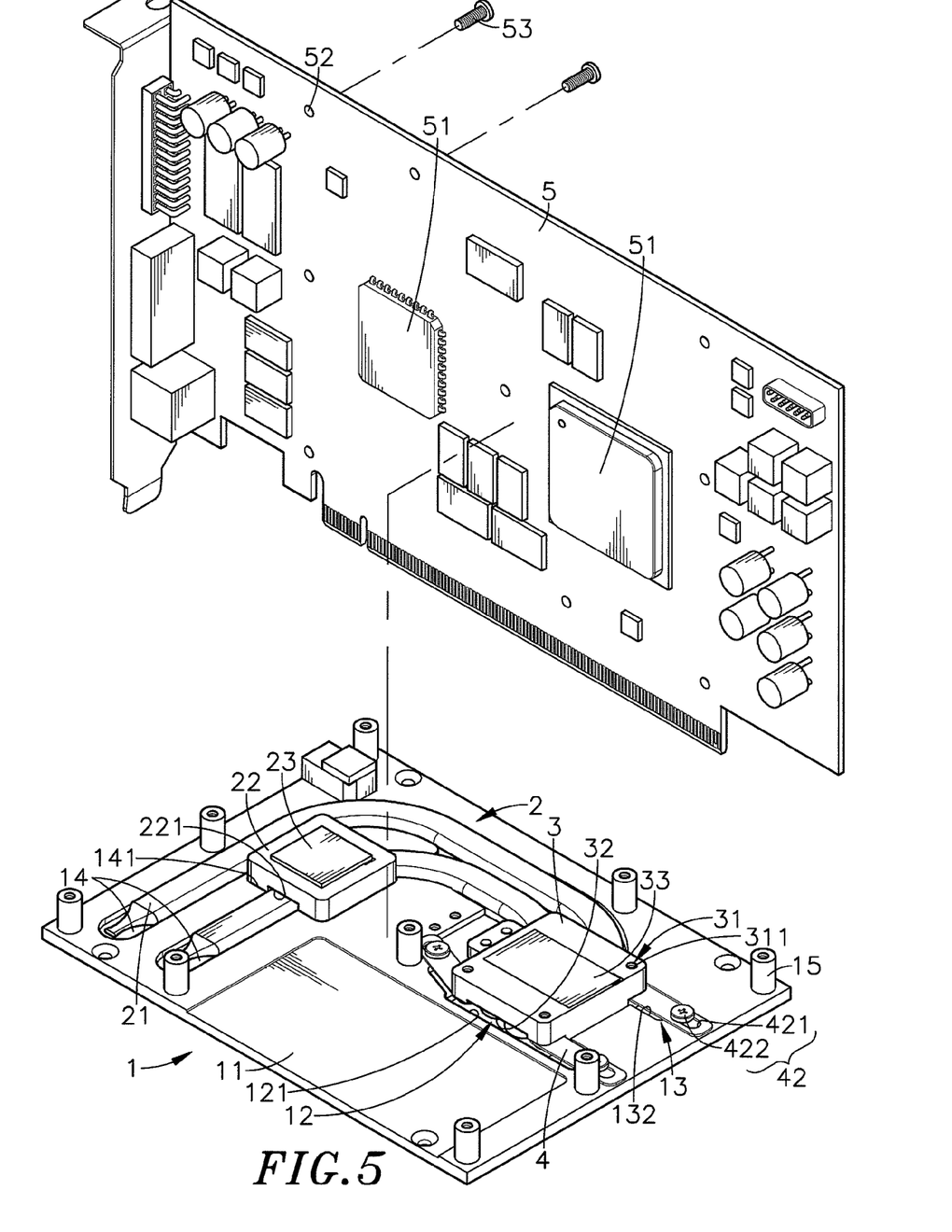
FIG. 5 is an exploded view illustrating an application example of the low thermal resistance cooler module in accordance with the present invention.
Figure 6:
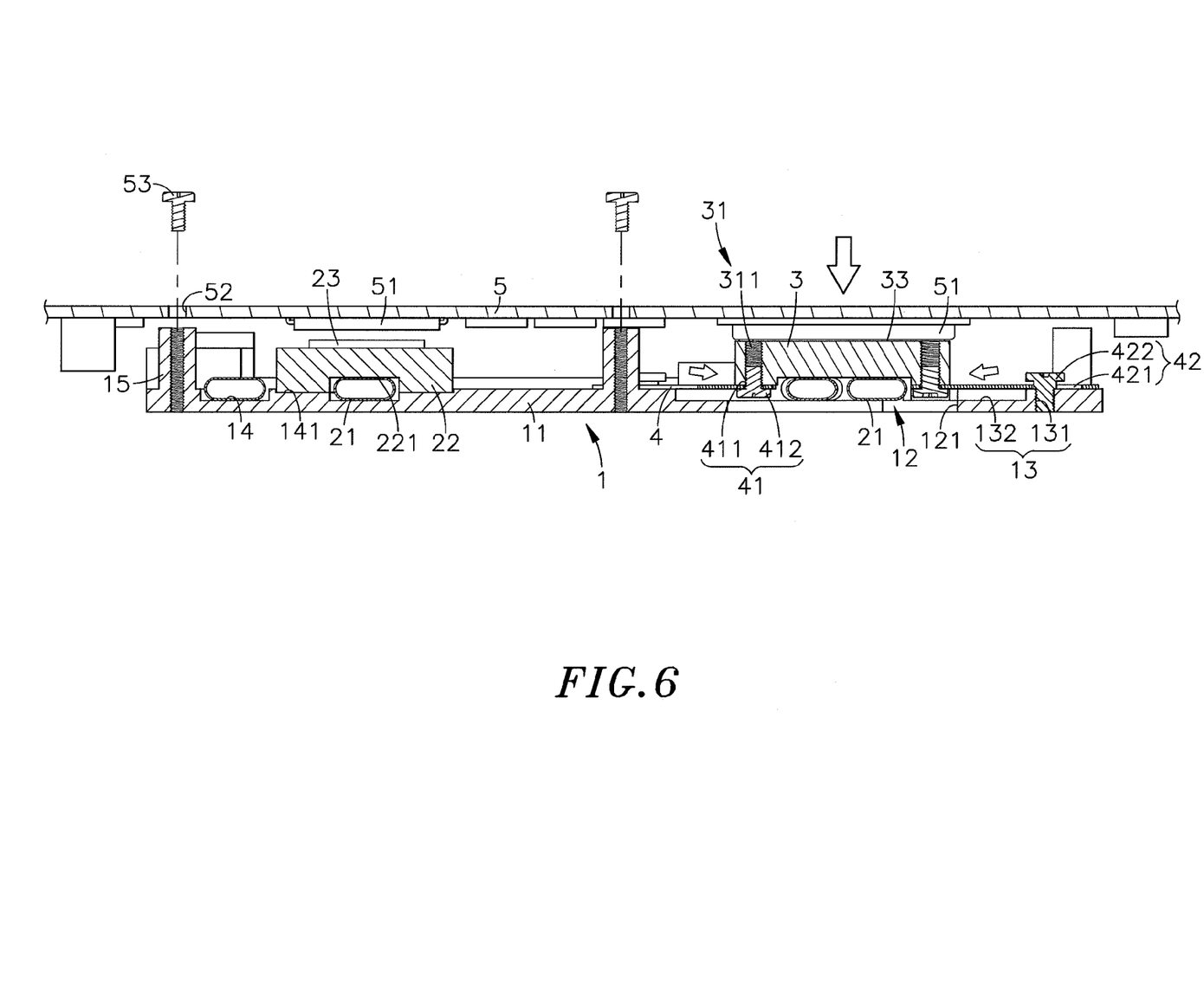
FIG. 6 is a schematic sectional applied view of the present invention, illustrating the low thermal resistance cooler module attached to the circuit board.
Figure 7:
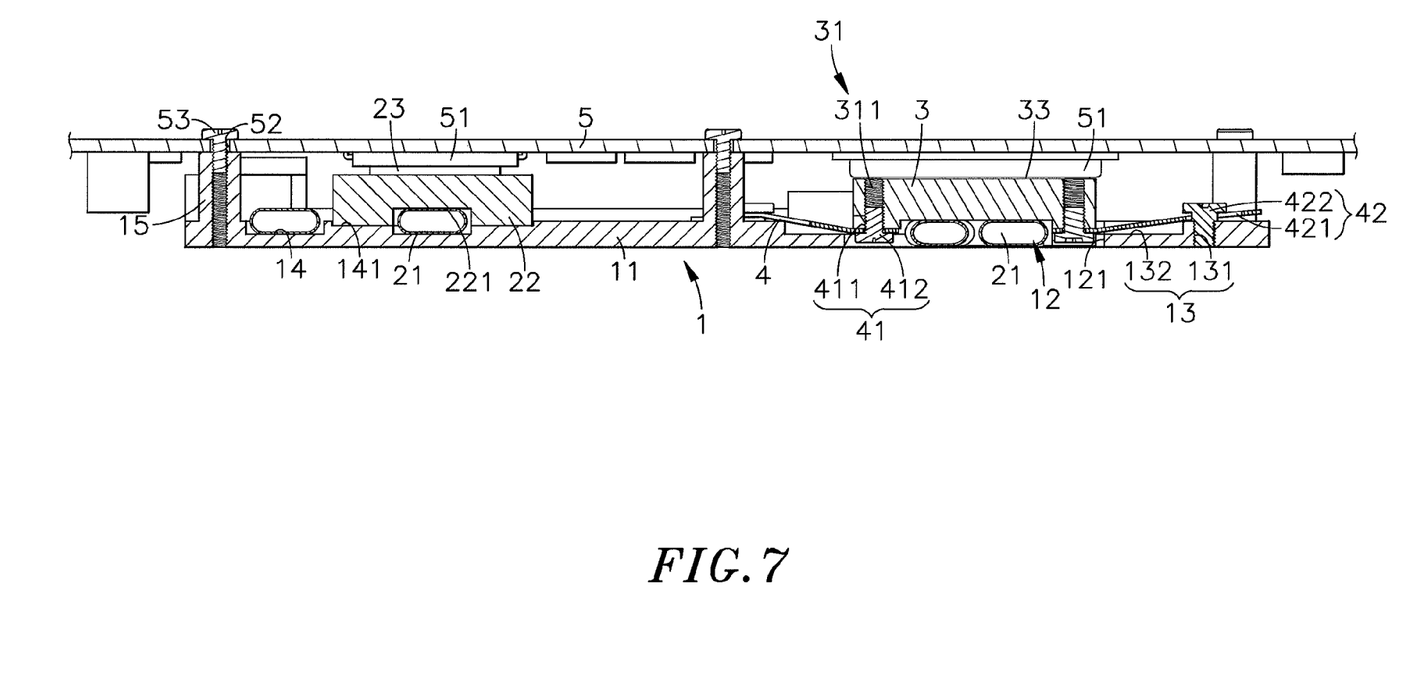
FIG. 7 corresponds to FIG. 6, illustrating the low thermal resistance cooler module and the circuit board affixed together.

Referring to FIGS. 5, 6 and 7, the low thermal resistance cooler module can be attached to a circuit board 5 to dissipate heat from electronic components at the circuit board 5. As illustrated, the circuit board 5 comprises a plurality of heat sources 51 that can be a CPU, image processor, chip module or any other electronic component. The low thermal resistance cooler module is attached to a circuit board 5 to keep the heat-transfer plate 23 of the heat sink 22 and the heat-transfer plate 33 of the heat-transfer block 3 in close contact with the heat sources 51 of the circuit board 5, and then respective screws 53 are inserted through respective mounting through holes 52 at the circuit board 5 and into the respective female screw rods 15 of the heat-transfer base member 1 to affix the heat-transfer base member 1 and the circuit board 5 together. After installation, the circuit board 5 is supported on the female screw rods 15 and kept at a distance from the flat base panel 11 of the heat-transfer base member 1, and therefore, open spaces are provided between the heat-transfer base member 1 and the circuit board 5 around the heat sink 22 and the heat-transfer block 3 for air circulation. Subject to the arrangement of the heat-transfer plate 23 of the heat sink 22 and the heat-transfer plate 33 of the heat-transfer block 3, the heat sink 22 and the heat-transfer block 3 can be kept in contact with the heat sources 51 of the circuit board 5 positively, compensating any manufacturing tolerances or uneven component surfaces. Further, after a phase change of the phase change material of the heat-transfer plate 33 of the heat-transfer block 3, the liquefied compound of the phase change material flows evenly within the pressed area that covers the whole working area of the respective heat source 51. This phase change material functions as a thermal paste, but it does not flow over unexpected area.

Further, when the low thermal resistance cooler module and the circuit board 5 are attached together, one heat source 51 of the circuit board 5 is stopped against the heat-transfer plate 33 of the heat-transfer block 3 to impart a pressure to the heat-transfer block 3 in direction toward the recess 12 of the heat-transfer base member 1. Because the connection plates 4 are suspending in the opening 121 of the heat-transfer base member 1 and have the first connection ends 41 and second connection ends 42 thereof respectively fastened to the mounting portions 31 of the heat-transfer block 3 and the respective mating connection structures 13 of the heat-transfer base member 1 by the tie screws 412 and the lock screws 422, the connection plates 4 buffer the pressure imparted by the circuit board 5 to the heat-transfer block 3 in direction toward the recess 12 of the heat-transfer base member 1, ensuring positive contact between the heat-transfer block 3 and the respective heat source 51 of the circuit board 5 that is stopped against heat-transfer plate 33. Subject to the structural design of the heat-transfer base member 1 and the heat-transfer block 3 and the arrangement of the heat-transfer base member 1, the heat-transfer block 3 and the connection plates 4, the vertical thickness of the low thermal resistance cooler module can be minimized, providing a low profile characteristic.

Further, the heat sink 22 and the heat-transfer block 3 can be made of aluminum or copper alloy. During operation of the heat sources 51 of the circuit board 5, the heat sink 22 and the heat-transfer block 3 absorb waste heat from the heat sources 51 and transfer absorbed waste heat to the heat pipes 2, wherein, the liquid in one end portion 21 (hot interface) of each of the flat heat pipes 2 turns into a vapor by absorbing heat from that end portion 21; the vapor then travels along the respective flat heat pipes 2 to the other end portions 21 (cold interface), condenses back into a liquid, releasing the latent heat; the liquid then returns to the hot interface through a capillary action where it evaporates once more and repeats the cycle.

Figure 8:
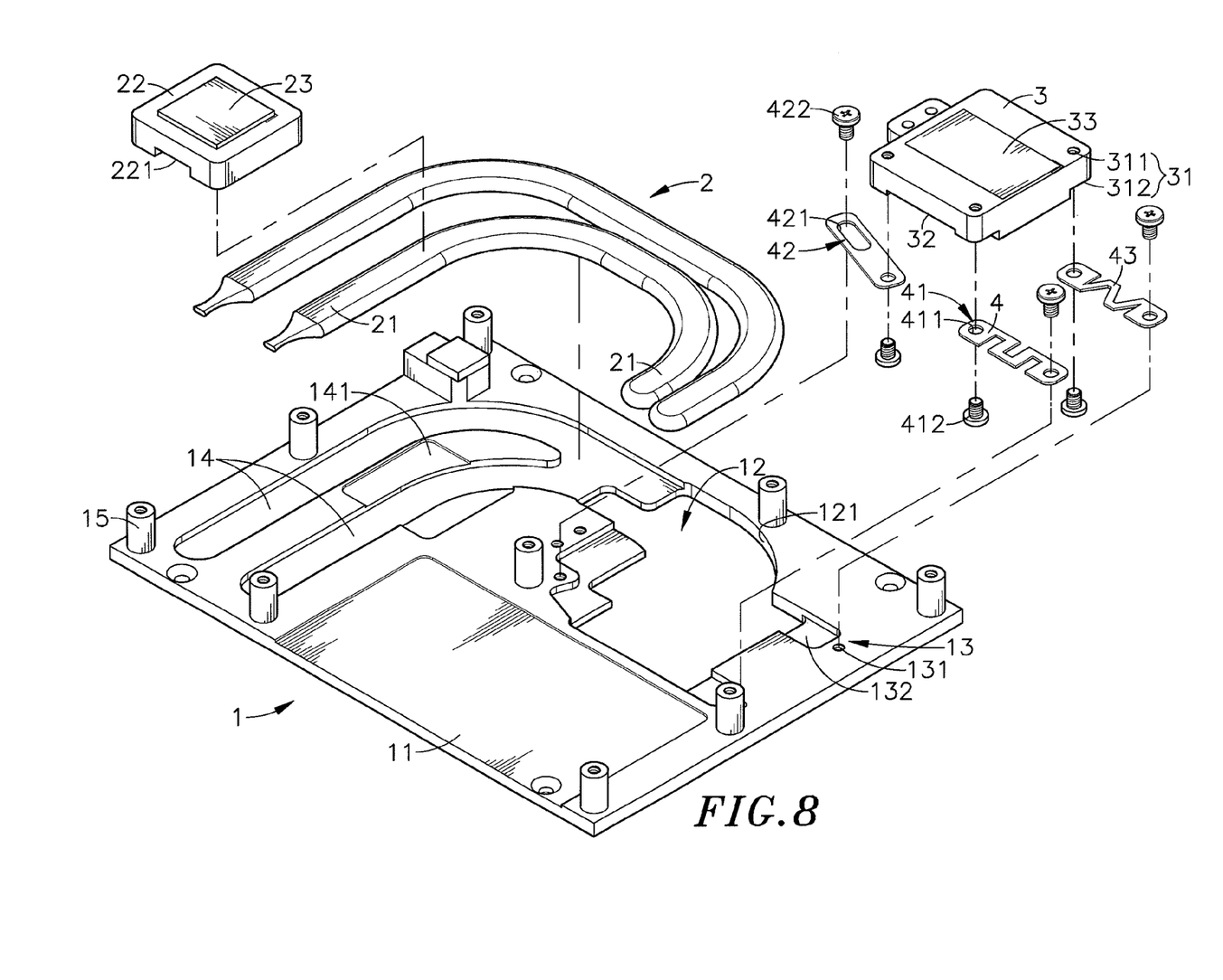
FIG. 8 is an exploded view of an alternate form of the low thermal resistance cooler module in accordance with the present invention.

Referring to FIG. 8 and FIGS. 2, 5 and 7 again, the connection plates 4 are flat, elongated metal plate members. The design of the oblong through hole 421 at the second connection end 42 of each connection plate 4 allows each connection plate 4 to be moved relative to the respective lock screw 422 to adjust the position. Further, in order to enhance the flexibility of the connection plates 4, each connection plate 4 can be made having an S-shaped, W-shaped, or zigzag-shaped, elastically deformable body connected between the first connection end 41 and second connection end 42 thereof.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A low thermal resistance cooler module, comprising:
   a heat-transfer base member comprising a flat base panel having opposing top and bottom walls, a recess located at the top wall of said flat base panel, a plurality of mating connection structures located at the top wall of said flat base panel around said recess, and at least one elongated, curved locating groove located at the top wall of said flat base panel and extended from said recess;
   at least one flat heat pipe set in said at least one elongated, curved locating groove, each said flat heat pipe comprising two opposing end portions, one said end portion forming a hot interface and the other said end portion forming a cold interface;
   a heat-transfer block fixedly mounted with the hot interface of each said flat heat pipe in said recess of said heat-transfer base member for transferring waste heat from a heat source of an external circuit board by direct contact, said heat-transfer block comprising a plurality of mounting portions disposed around the border area thereof; and
   a plurality of connection plates each comprising a first connection end respectively connected to said mounting portions of said heat-transfer block and a second connection end respectively connected to said mating connection structures of said heat-transfer base member, wherein said heat-transfer base member further comprises a rectangular locating groove located at the top wall of said flat base panel; one said elongated, curved heat pipe groove extends across of said rectangular locating groove, the low thermal resistance cooler module further comprises a heat sink bonded to said rectangular locating, groove of said heat-transfer base member to hold down one said flat heat pipe in one said elongated, curved heat pipe groove, said heat sink comprising a heat-transfer elate arranged at a top side thereof.

2. The low thermal resistance cooler module as claimed in claim 1, wherein said heat-transfer base member further comprises an opening cut through said recess; each said elongated, curved locating groove is connected to said opening of said heat-transfer base member.

3. The low thermal resistance cooler module as claimed in claim 1, wherein said heat-transfer block comprises a plurality of vertical screw holes respectively formed in said mounting portions; each said mating connection structure of said heat-transfer base member comprises a screw hole; each said connection plate further comprises a circular through hole at the first connection end thereof and an oblong through hole at the second end thereof, the circular through holes and oblong through holes of said connection plates being respectively affixed to the vertical screw holes in said mounting portions of said heat-transfer block and the screw holes of said mating connection structures of said heat-transfer base member by respective screws.

4. The low thermal resistance cooler module as claimed in claim 3, wherein each said mating connection structure comprises a positioning groove extended from said recess and adapted to accommodate the second connection end of one said connection plate.

5. The low thermal resistance cooler module as claimed in claim 3, wherein said heat-transfer block further comprises a stepped bottom groove located at a bottom side of each said mounting portion for receiving the first connection end of one said connection plate.

6. The low thermal resistance cooler module as claimed in claim 1, wherein said heat sink further comprises a positioning groove defined in a bottom side thereof and tightly attached to the respective said flat heat pipe.

7. The low thermal resistance cooler module as claimed in claim 1, wherein said heat-transfer block further comprises a positioning groove defined in a bottom side thereof and tightly attached to the hot interface of each said flat heat pipe.

8. The low thermal resistance cooler module as claimed in claim 1, wherein said heat-transfer block further comprises a heat-transfer plate of a phase change material arranged at a top side thereof.

9. The low thermal resistance cooler module as claimed in claim 1, wherein each said connection plate is configured having a curved, elastically deformable body connected between the first connection end and second connection end thereof.

\* \* \* \* \*